(12) United States Patent
Li

(10) Patent No.: US 9,985,140 B2
(45) Date of Patent: May 29, 2018

(54) PIXEL ARRAY STRUCTURE HAVING DOPED ACTIVE LAYER WITH UNEVEN THICKNESS AND MANUFACTURING METHOD THEREOF, ARRAY SUBSTRATE AND DISPLAY DEVICE

(71) Applicants: BOE Technology Group Co., Ltd., Beijing (CN); BEIJING BOE OPTOELECTRONICS TECHNOLOGY CO., LTD., Beijing (CN)

(72) Inventor: Tiansheng Li, Beijing (CN)

(73) Assignees: BOE Technologies Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days. days.

(21) Appl. No.: 14/426,298

(22) PCT Filed: Jul. 18, 2014

(86) PCT No.: PCT/CN2014/082563
§ 371 (c)(1),
(2) Date: Mar. 5, 2015

(87) PCT Pub. No.: WO2015/090059
PCT Pub. Date: Jun. 25, 2015

(65) Prior Publication Data
US 2016/0027930 A1    Jan. 28, 2016

(30) Foreign Application Priority Data
Dec. 18, 2013    (CN) .......................... 2013 1 0697673

(51) Int. Cl.
*H01L 27/14*    (2006.01)
*H01L 29/04*    (2006.01)
(Continued)

(52) U.S. Cl.
CPC ...... *H01L 29/78696* (2013.01); *G02F 1/1368* (2013.01); *H01L 27/127* (2013.01); *H01L 27/1222* (2013.01); *H01L 27/1288* (2013.01)

(58) Field of Classification Search
CPC ............... H01L 27/1222; H01L 27/127; H01L 27/1288; H01L 29/78696
See application file for complete search history.

(56) References Cited

U.S. PATENT DOCUMENTS 5,326,712 A    7/1994 Bae
5,650,358 A    7/1997 Gu et al.
(Continued)

FOREIGN PATENT DOCUMENTS

CN    1971390 A    5/2007
CN    101226964 A    7/2008
(Continued)

OTHER PUBLICATIONS

Jun. 21, 2016—(WO) IPRP—App. No. PCT/CN14/082563.
(Continued)

*Primary Examiner* — Ismail Muse
(74) *Attorney, Agent, or Firm* — Banner & Witcoff, Ltd.

(57) ABSTRACT

A pixel array structure and manufacturing method thereof, an array substrate and a display device are provided. The manufacturing method of the pixel array structure includes: forming a doped active layer over an active layer, the doped active layer having a portion with a larger thickness and a portion with a smaller thickness; forming a source/drain metal layer on the doped active layer and the active layer; conducting an etching process on the source/drain metal layer, so as to form a source electrode and a drain electrode, one of which partially covers the portion of the doped active layer with a larger thickness; conducting an etching process on the doped active layer and the active layer in a region
(Continued)

between the source electrode and the drain electrode, forming an optimized channel. With the manufacturing method, the on-state current of a channel of a thin film transistor can be raised.

12 Claims, 3 Drawing Sheets

(51) Int. Cl.
*H01L 29/15* (2006.01)
*H01L 31/036* (2006.01)
*H01L 29/786* (2006.01)
*H01L 27/12* (2006.01)
*G02F 1/1368* (2006.01)

(56) References Cited

U.S. PATENT DOCUMENTS

| | | | | |
|---|---|---|---|---|
| 2006/0228974 | A1* | 10/2006 | Thelss | H01L 29/7869 445/24 |
| 2010/0075475 | A1* | 3/2010 | Takasawa | H01L 29/458 438/197 |
| 2012/0007081 | A1* | 1/2012 | Chung | H01L 27/1214 257/59 |
| 2012/0315715 | A1* | 12/2012 | Cho | G02F 1/1368 438/30 |
| 2013/0027627 | A1* | 1/2013 | Kang | H01L 29/41733 349/46 |
| 2013/0182210 | A1* | 7/2013 | Koh | G02F 1/134363 349/141 |
| 2013/0321729 | A1* | 12/2013 | Hirosawa | G02F 1/134363 349/41 |

FOREIGN PATENT DOCUMENTS

| | | |
|---|---|---|
| CN | 101315950 A | 12/2008 |
| CN | 102709329 A | 10/2012 |
| CN | 103311310 A | 9/2013 |
| CN | 103413834 A | 11/2013 |
| CN | 103700667 A | 4/2014 |

OTHER PUBLICATIONS

International Search Report and Written Opinion dated Sep. 28, 2014 (PCT/CN2014/082563): ISA/CN.

Apr. 5, 2016—(CN)—Second Office Action Appn 201310697673.2 with English Tran.

Sep. 21, 2016—(CN)—Third Office Action Appn 201310697673.2 with English Tran.

* cited by examiner

US 9,985,140 B2

PIXEL ARRAY STRUCTURE HAVING DOPED ACTIVE LAYER WITH UNEVEN THICKNESS AND MANUFACTURING METHOD THEREOF, ARRAY SUBSTRATE AND DISPLAY DEVICE

The application is a U.S. National Phase Entry of International Application No. PCT/CN2014/082563 filed on Jul. 18, 2014, designating the United States of America and claiming priority to Chinese Patent Application No. 201310697673.2 filed on Dec. 18, 2013. The present application claims priority to and the benefit of the above-identified applications and the above-identified applications are incorporated by reference herein in their entirety.

TECHNICAL FIELD

Embodiments of the present invention relate to a pixel array structure and manufacturing method thereof, an array substrate and a display device.

BACKGROUND

At present, an important developing direction of Thin Film Transistor Liquid Crystal Displays (TFT-LCDs) is low energy consumption and high quality, which is also a focus of research in the field of display. To achieve the above purpose, it is necessary to improve the charging capacity of TFTs, that is, fast charging of TFTs can be realized within a certain period of time.

SUMMARY

According to at least an embodiment of the present invention, there is provided a manufacturing method of a pixel array substrate, for increasing the on-state current of a TFT channel, and thereby improving the charging capacity of TFTs.

According to at least an embodiment of the invention, there is provided a manufacturing method of a pixel array structure, comprising: forming a doped active layer on an active layer, the doped active layer having a portion with a larger thickness and a portion with a smaller thickness; forming a source/drain metal layer on the doped active layer and the active layer; conducting an etching process on the source/drain metal layer, so as to form a source electrode and a drain electrode, one of which partially covers the portion of the doped active layer with a larger thickness; conducting an etching process on the doped active layer and the active layer between the source electrode and the drain electrode, so as to form an optimized channel located between the retained portion of the doped active layer having a larger thickness and the other of the source electrode and the drain electrode.

According to at least an embodiment of the invention, there is further provided a pixel array structure, comprising: a base substrate and a gate electrode formed in a same layer on the base substrate; a gate insulating layer, an active layer and a doped active layer formed on the gate electrode in sequence, the doped active layer having a portion with a larger thickness and a portion with a smaller thickness; a source/drain electrode layer over the doped active layer, which includes a source electrode and a drain electrode, wherein one of the source electrode and the drain electrode partially covers the portion of the doped active layer with a larger thickness, and an optimized channel is provided between the doped active layer retained between the source electrode and the drain electrode and the other of the source electrode and the drain electrode.

According to at least an embodiment of the invention, there is further provided an array substrate, comprising the pixel array structure as stated above.

According to at least an embodiment of the invention, there is further provided a display device, comprising an array substrate and a counter substrate, wherein the array substrate is the array substrate as stated above.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

The key to solve such a problem that charging capacity of a TFT is insufficient is to raise on-state current. For a TFT channel, its on-state current Ion=W/L, where W is a width of the channel, L is a length of the channel, and a size of the on-state current depends on a width-to-length ratio (W/L) of the channel. In order to raise the on-state current, it is possible that the width of the channel is increased or the length of the channel is reduced. As to small-size display products, due to restrictions on equipment accuracy, a length of a channel cannot be made to be very small, and consequently, the only thing to do is to increase the width of the channel. However, due to restrictions of panel layout, it is also impossible for a small-size, high-PPI (Pixels Per Inch) product to increase the width of a channel unlimitedly.

Figure 1:
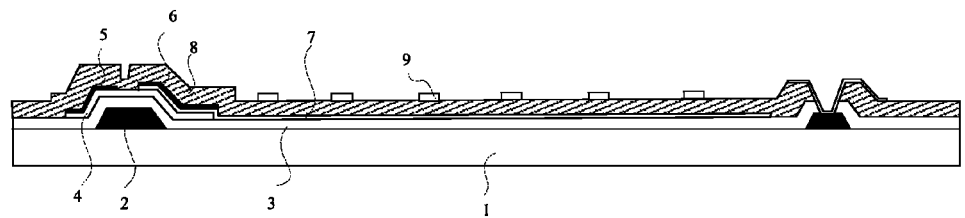
FIG. 1 is a schematically sectional view illustrating a pixel array structure.

A pixel array structure in a TFT-LCD is shown in FIG. 1. In the course of forming the pixel array structure, a gate electrode layer is formed on a glass substrate 1 and is etched to form a gate electrode 2; a gate insulating layer 3 (Gate Insulator, briefly called as GI layer) is formed layer-by-layer on the gate electrode 2; an active layer 4 is formed on the gate insulating layer 3 and is etched, so that only a portion located over the gate electrode 2 is retained; after that, a first pixel electrode 7 is formed on a part of the active layer 4 and the gate insulating layer 3; a source/drain metal layer is formed on the active layer 4 over the gate electrode 2 and on the first pixel electrode 7, and is etched to form a source electrode 5 and a drain electrode 6. Furthermore, a passivation layer 8 and a second pixel electrode 9 may further be formed on this basis.

When the above structure is used to raise the on-state current of a TFT channel, a bottleneck is still present, and the charging capacity of the TFT cannot be effectively improved.

According to at least an embodiment of the invention, there is provided a manufacturing method of an array structure, including the following steps.

Step S1, a doped active layer is formed on an active layer, and the doped active layer has a portion with a larger thickness.

Step S2, a source/drain metal layer is formed over the doped active layer and the active layer, and the source/drain metal layer covers the doped active layer.

Step S3, the source/drain metal layer is etched, so as to form a source electrode and a drain electrode.

Step S4, the doped active layer and the active layer between the source electrode and the drain electrode are etched, so as to form an optimized channel.

Through the above steps, the doped active layer is formed consecutively after deposition of the active layer, and it covers the active layer that has been manufactured (patterned) and has a portion with a larger thickness and a portion with a smaller thickness. After deposition of the source/drain metal layer, the source/drain metal layer is etched to form the source electrode and the drain electrode, which cover the portion of the doped active layer with a larger thickness in part. After that, the active layer and the doped active layer that are exposed in a region between the source electrode and the drain electrode are etched in a same process, so that the portion of the doped active layer with a smaller thickness is removed at least, and the portion of the doped active layer with a larger thickness is retained. Because the retained doped active layer in the region between the source electrode and the drain electrode serves as a conductor, and is electrically connected to the source electrode or the drain electrode that covers the doped active layer and is obtained from the source/drain metal layer, the remaining doped active layer can be equivalent to the extension length of the drain electrode. Consequently, this shortens the formed channel length (namely, a shorter, optimized channel is obtained), and so, the on-state current can be further raised.

In at least an embodiment of the present invention, before the step S1, it may further includes the following steps:

Step S01, a gate electrode and a gate insulating layer are produced on a glass substrate.

Step S02, an active layer is formed on the gate insulating layer and etched, so that only the active layer corresponding to the position where the gate electrode is located is retained.

Figure 2:
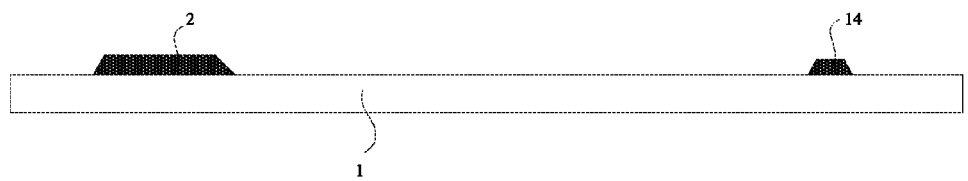
FIG. 2 is a schematic view illustrating formation of a gate electrode according to an embodiment of the invention.

As shown in FIG. 2, in the step S01, a gate electrode metal layer is deposited on a glass substrate 1. The gate electrode metal layer in a display area is etched to form a gate electrode 2, and the gate electrode metal layer in a non-display area is retained to form a storage capacitor 14. Here, the base substrate is for example a glass substrate, or it may be a plastic substrate or the like. In an example, before fabrication of the gate electrode, a buffer layer or other layered structure may have already been fabricated on the base substrate, and the buffer layer is such as an inorganic insulating layer of silicon oxide, silicon nitride or the like.

Figure 3:
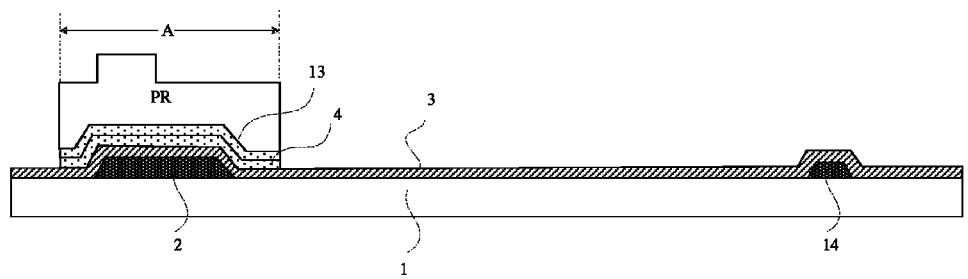
FIG. 3 is a schematic view illustrating formation of an active layer and a doped active layer according to an embodiment of the invention.

As shown in FIG. 3, a gate insulating layer 3 is deposited on the gate electrode 2 and the exposed glass substrate 1, and an active layer 4 and a doped active layer 13 are deposited on the gate insulating layer 3. Next, a photoresist (PR) layer is applied on the doped active layer 13, and is exposed with a gray-tone or half-tone mask so as to obtain a photoresist mask with different thicknesses in different portions, such as a photoresist in a region A shown in FIG. 3. After that, the active layer 4 and the doped active layer 13 outside the region A are etched off with the photoresist mask, so that only the active layer 4, the doped active layer 13 and the photoresist (PR) in the region A are retained. An example of the photoresist is obtained from a mixed liquid, which is composed of three main components: a photosensitive resin, a sensitizer (see spectral sensitizing dye) and a solvent, and is sensitive to light.

Figure 4:
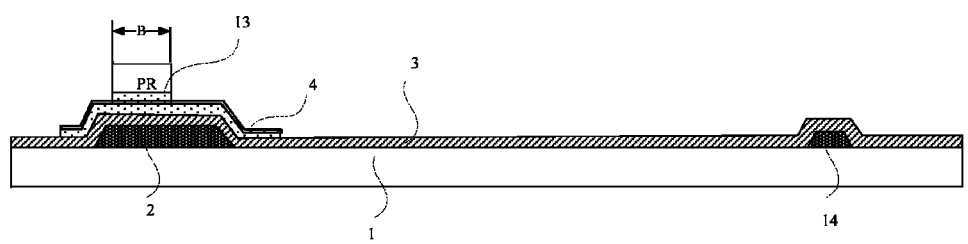
FIG. 4 is a schematic view after etching of a doped active layer according to an embodiment of the invention.

As shown in FIG. 4, the photoresist PR is etched (ashed) further so as to only retain a part of the photoresist in a region B, and taking the remaining photoresist as an etch mask, the doped active layer 13 is etched. For example, a HT (Hyper Transport) technology (an end-to-end bus technology designed for interconnection among integrated circuits on a motherboard) may be employed for etching of the doped active layer 13, so that the doped active layer 13 under the photoresist in the region B is retained, thereby attaining a portion 51 of the doped active layer 13 with a thicker thickness, and meanwhile, on a surface of the active layer 4 outside the region B, there is also retained the doped active layer 13 with a certain thickness, thereby attaining a portion 52 of the active layer 13 with a smaller thickness. During the etching, a thickness of the doped active layer 13 with a smaller thickness retained on the surface of the active layer 4 may be controlled by, such as, controlling the etch time. Thus, the resultant doped active layer 13 has a larger thickness within the region B, and has a smaller thickness outside the region B.

Thickness of the doped active layer 13 in at least an embodiment of the present invention may be 4 to 7 times (e.g., 5 times) the thickness of the active layer 4.

The doped active layer 13 in at least an embodiment of the present invention covers the active layer 4, and may have different thicknesses. For example, the thicker portion of the doped active layer lies on the side where the drain electrode is located in FIG. 4. In an actual operation, the thickness portion of the doped active layer 13 may be set depending on demands, and for example, it is provided on a side where the source electrode or the drain electrode is located.

Figure 5:
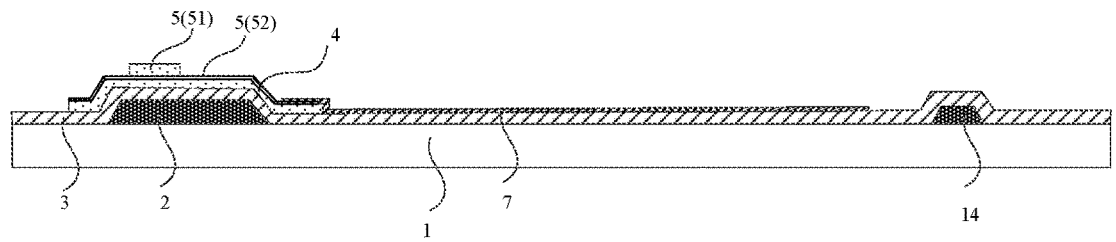
FIG. 5 is a schematic view illustrating formation of a first pixel electrode layer according to an embodiment of the invention.

As shown in FIG. 5, in at least an embodiment of the invention, after the active layer 4 and the doped active layer 13 are formed on a side of the source electrode, and before the source/drain metal layer is formed, the method further includes forming a first pixel electrode layer 7, and the first pixel electrode layer 7 does not completely cover the active layer 4, and moreover covers the gate insulating layer 3 uncovered by the active layer 4. For example, an etching is carried out on the active layer 4 and the gate insulating layer 3 with the shielding function a mask, so as to obtain the first pixel electrode layer 7. With the aid of the doped active layer 13 retained on the active layer 4, the first pixel electrode layer 7 is electrically connected to the active layer, and in this case, the doped active layer 13 functions as an ohmic contact layer.

Figure 6:
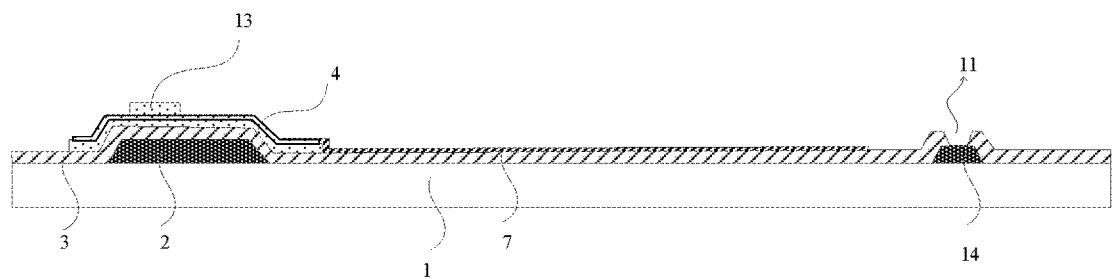
FIG. 6 is a schematic view illustrating formation of a via hole by etching a gate insulating layer according to an embodiment of the invention.

As shown in FIG. 6, the gate insulating layer 3 over the storage capacitor 14 is etched, so as to form a via hole 11.

Figure 7:
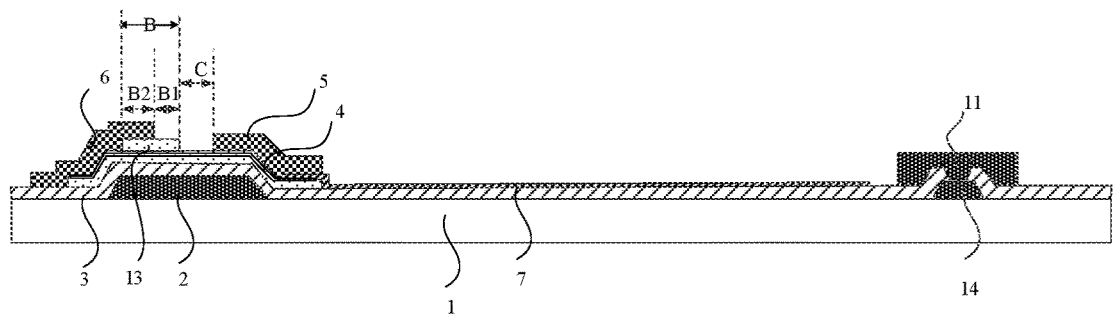
FIG. 7 is a schematic view illustrating formation of a source electrode and a drain electrode by etching according to an embodiment of the invention.

On the basis of the structure as shown in FIG. 6, a source/drain metal layer is deposited consecutively, and then etched and patterned, so that the source/drain metal layer in the place where a portion B1 in the region B as well as a region C is located is etched off, and only the metal layer in a region B2 is retained to act as a drain electrode 6. The metal layer retained on the other side acts as a source electrode 5, thereby attaining the source electrode 5 and the drain electrode 6, as shown in FIG. 7. It is to be noted that, while the source electrode 5 and the drain electrode 6 are formed on the gate electrode 2, the source/drain metal layer is deposited over the gate insulating layer 3 having a via hole 11 therein, so that a signal access terminal 10 over and surrounding the via hole 11 is formed.

Figure 8:
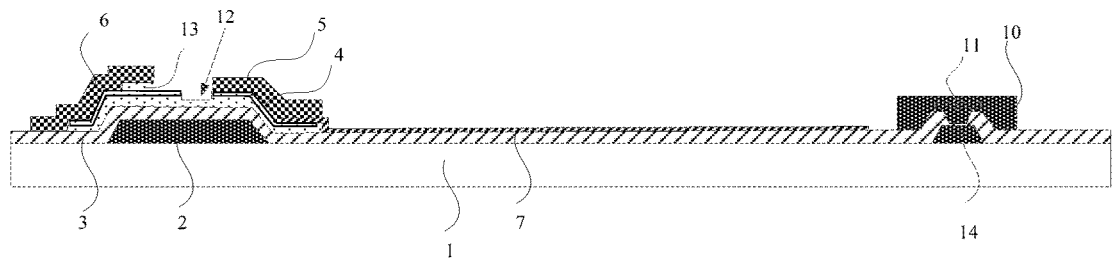
FIG. 8 is a schematic view illustrating formation of an optimized channel according to an embodiment of the invention.

As shown in FIG. 8, etching is then performed on the portion of the doped active layer 13 with a larger thickness exposed in the region B1, the portion of the doped active layer 13 with a smaller thickness and corresponding active layer 4 in the region C, and proceeds until the portion of the doped active layer 13 with a smaller thickness within the region C is removed (correspondingly the active layer 4 may be etched partially). Thus, an optimized channel 12 is formed at the region C, and a width of the optimized channel 12 is in the range of 1 to 3 micrometers. The etching process may be achieved by controlling the etch time or using an apparatus for monitoring an etching endpoint.

Figure 9:
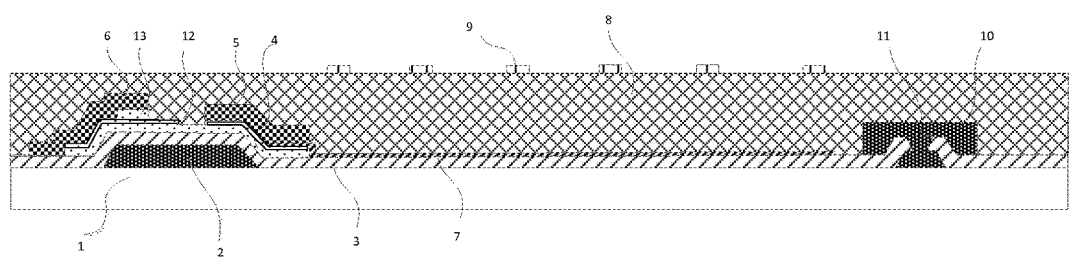
FIG. 9 is a schematic view illustrating a resultant array substrate in an embodiment of the invention.

After the optimized channel is obtained, as shown in FIG. 9, a passivation layer (PVX) 8 is formed on the above structure, and a second pixel electrode layer 9 with slits distributed at an interval is formed on the passivation layer 8, to thereby obtain an array substrate finally. At least one of the first pixel electrode layer 7 and the second pixel electrode layer 9 is a comb-like electrode.

In summary, by the manufacturing method of the pixel array structure provided by at least an embodiment of the present invention, a doped active layer with different thicknesses is formed on an active layer consecutively, and then, the doped active layer and the active layer are etched in a same process. Because the doped active layer may be deemed as a conductor, it may be equivalent to an extension of a drain electrode, and an effect of shortening the channel length is formed. Further, an on-state current is raised. The method is more helpful to mass production, thereby improving the production efficiency.

According to at least an embodiment of the invention, there is further provided a pixel array substrate, which can be obtained by the manufacturing method as stated in the above embodiments.

According to at least an embodiment of the invention, there is further provided an array substrate, which includes a glass substrate and a pixel array structure on the glass substrate. The pixel array structure can be formed by the manufacturing method as stated in the above embodiments.

The structure of the array substrate is shown in FIG. 9. A gate electrode 2 and a storage capacitor 14 provided in the same layer are formed on a glass substrate 1, a gate insulating layer 3, an active layer 4 and a doped active layer 13 that incompletely covers the active layer 4 are formed on the gate electrode 2 in sequence, a source electrode 5 and a drain electrode 6 that are formed by etching after deposition of a source/drain metal layer are provided on the doped active layer 13, and along a region between the source electrode 5 and the drain electrode 6, an optimized channel 12 is formed by conducting an incomplete etching on the doped active layer 13 and the active layer 4 at the same time. The optimized channel 12 is located between the doped active layer 13 retained between the source electrode 5 and the drain electrode 6 and another electrode (source electrode 5 or drain electrode 6) opposed to the doped active layer 13. For example, the width of the optimized channel 12 is in the range of 1 to 3 micrometers.

For example, a first pixel electrode 7 is also formed on the source electrode 5 side, and it covers the active layer 4 incompletely and moreover covers the gate insulating layer 3 uncovered by the active layer 4.

Furthermore, a via hole 11 is formed by etching the gate insulating layer 3 over the storage capacitor 14. While the source electrode 5 and the drain electrode 6 are formed on the gate electrode 2, the source/drain metal layer is also deposited over the gate insulating layer 3 that has a via hole 11 over the storage capacitor 14, so as to form a signal access terminal 10 over and surrounding the via hole 11.

After the optimized channel 12 is obtained, a passivation layer (PVX) 8 and a second pixel electrode layer 9 are formed on the resultant structure, and the second pixel electrode layer 9 comprises slits distributed at an interval, and for example, it is a comb-like electrode.

Based on the above array substrate, in at least an embodiment of the present invention, there is further provided a display device, including an array substrate and a counter substrate, in which the array substrate is the above-mentioned array substrate.

Figure 10:
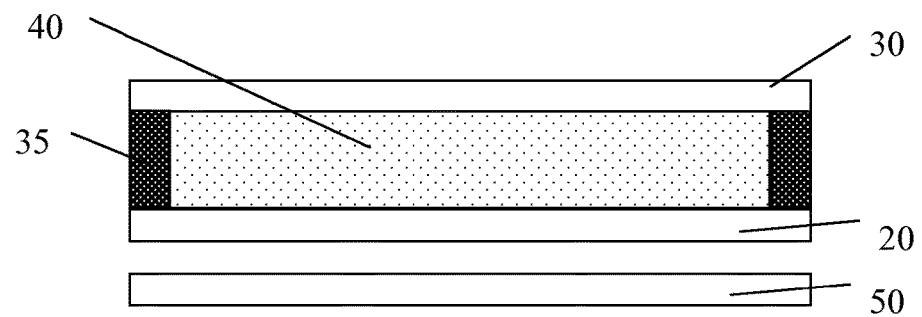
FIG. 10 is a schematic view illustrating a display device in an embodiment of the invention.

For example, a liquid crystal display, as shown in FIG. 10, includes a counter substrate 30 and an array substrate 20; which are disposed opposite to each other and are formed into a liquid crystal cell with the aid of a sealant 35, with a liquid crystal material 40 being filled in the liquid crystal cell. A pixel electrode for each pixel unit of the array substrate 20 serves to apply an electric field for control of the rotation degree of the liquid crystal material, so as to perform a display operation. The counter substrate may be a color filter substrate, on which color filter sub-pixels are formed. In some embodiments, the display device may include a backlight source 50 for providing the array substrate 20 with backlight.

Descriptions made above are merely exemplary embodiments of the invention, but are not used to limit the protection scope of the invention. The protection scope of the invention is determined by attached claims.

This application claims the benefit of priority from Chinese patent application No. 201310697673.2, filed on Dec. 18, 2013, the disclosure of which is incorporated herein in its entirety by reference as a part of the present application.

What is claimed is:

1. A manufacturing method of a pixel array structure, comprising:
   forming a doped active layer on an active layer, the doped active layer comprising a portion having a first thickness and a portion having a second thickness, wherein the second thickness is less than the first thickness;
   forming a source/drain metal layer on the doped active layer and the active layer;

conducting an etching process on the source/drain metal layer, so as to form a source electrode and a drain electrode, one of which partially covers the portion of the doped active layer having the first thickness; and conducting an etching process on the doped active layer and the active layer between the source electrode and the drain electrode, so as to form a channel located between a remaining portion of the doped active layer having the first thickness and the other of the source electrode and the drain electrode, wherein the doped active layer and the active layer between the source electrode and the drain electrode are etched in a same process, until the portion of the doped active layer having the second thickness is removed.

2. The manufacturing method of the pixel array structure claimed as claim 1, wherein the first thickness of the doped active layer is 4 to 7 times a thickness of the active layer.

3. The manufacturing method of the pixel array structure claimed as claim 2, wherein the first thickness of the doped active layer is 5 times the thickness of the active layer.

4. The manufacturing method of the pixel array structure claimed as claim 1, wherein a width of the channel is in a range of 1 to 3 micrometers.

5. The manufacturing method of the pixel array structure claimed as claim 1, wherein with a half-tone or gray-tone mask, the doped active layer comprising the portion having the first thickness is formed on the active layer.

6. The manufacturing method of the pixel array structure claimed as claim 1, wherein before formation of the doped active layer over the active layer, the method further comprises:

producing a gate electrode and a gate insulating layer on a base substrate; and forming the active layer on the gate insulating layer, and conducting an etching process on the active layer to remove the active layer in areas outside of where the gate electrode is located.

7. The manufacturing method of the pixel array structure claimed as claim 5, wherein the source electrode partially covers the portion of the doped active layer having the first thickness, and wherein before formation of the source/drain metal layer, the method further comprises:

forming a first pixel electrode layer, and allowing the first pixel electrode layer to cover the active layer incompletely, and to cover a gate insulating layer uncovered by the active layer.

8. A pixel array structure, comprising:

a base substrate and a gate electrode formed on the base substrate;

a gate insulating layer, an active layer and a doped active layer formed on the gate electrode in sequence, the doped active layer comprising a portion having a first thickness and a portion having a second thickness, wherein the second thickness is less than the first thickness; and a source/drain electrode layer formed over the doped active layer, wherein the source/drain electrode layer comprises a source electrode and a drain electrode, wherein only one electrode of the source electrode and the drain electrode partially covers the portion of the doped active layer having the first thickness, and a channel is provided between a doped active layer retained between the one electrode and the other of the source electrode and the drain electrode.

9. An array substrate, comprising the pixel array structure claimed as claim 8.

10. A display device, comprising an array substrate claimed as claim 9 and a counter substrate.

11. The manufacturing method of the pixel array structure claimed as claim 6, wherein the source electrode partially covers the portion of the doped active layer having the first thickness, and wherein, before formation of the source/drain metal layer, the method further comprises:

forming a first pixel electrode layer, and allowing the first pixel electrode layer to cover the active layer incompletely, and to cover the gate insulating layer uncovered by the active layer.

12. A manufacturing method of a pixel array structure, comprising:

forming a doped active layer on an active layer, the doped active layer comprising a portion having a first thickness and a portion having a second thickness, wherein the second thickness is less than the first thickness;

forming a source/drain metal layer on the doped active layer and the active layer;

conducting an etching process on the source/drain metal layer, so as to form a source electrode and a drain electrode, one of which partially covers the portion of the doped active layer having the first thickness;

conducting an etching process on the doped active layer and the active layer between the source electrode and the drain electrode, so as to form a channel located between a remaining portion of the doped active layer having the first thickness and the other of the source electrode and the drain electrode;

wherein before formation of the doped active layer over the active layer, the method further comprises:

producing a gate electrode and a gate insulating layer on a base substrate; and forming the active layer on the gate insulating layer, and conducting an etching process on the active layer to remove the active layer in areas outside of where the gate electrode is located.

* * * * *